United States Patent
Ikakura et al.

(10) Patent No.: US 6,472,334 B2
(45) Date of Patent: Oct. 29, 2002

(54) FILM FORMING METHOD, SEMICONDUCTOR DEVICE MANUFACTURING METHOD, AND SEMICONDUCTOR DEVICE

(75) Inventors: Hiroshi Ikakura, Tokyo (JP); Tomomi Suzuki, Tokyo (JP); Kazuo Maeda, Tokyo (JP); Yoshimi Shioya, Tokyo (JP); Kouichi Ohira, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/824,106

(22) Filed: Apr. 3, 2001

(65) Prior Publication Data

US 2001/0041458 A1 Nov. 15, 2001

(30) Foreign Application Priority Data

Apr. 7, 2000 (JP) ........................................ 2000-106937

(51) Int. Cl.$^7$ ............................................. H01L 21/469

(52) U.S. Cl. ...................................................... 438/778
(58) Field of Search ............................... 438/758, 778, 438/780, 789, 790

(56) References Cited

U.S. PATENT DOCUMENTS

| 5,605,867 A | 2/1997 | Sato et al. ................... 437/235 |
| 5,656,337 A | 8/1997 | Park et al. ................... 427/539 |
| 5,710,079 A | * 1/1998 | Sukharev ..................... 438/778 |
| 6,147,009 A | * 11/2000 | Grill et al. ................... 438/780 |

FOREIGN PATENT DOCUMENTS

JP 11-288931 10/1999

* cited by examiner

Primary Examiner—Michael Sherry
Assistant Examiner—Lisa Kilday
(74) Attorney, Agent, or Firm—Lorusso & Loud

(57) ABSTRACT

There is provided a method of forming a silicon-containing insulating film on a substrate by reacting a compound having siloxane bonds and Si—R bonds (R is alkyl group) with a plasmanized reaction gas containing an oxidizing gas and $H_2$.

15 Claims, 4 Drawing Sheets

FILM FORMING METHOD, SEMICONDUCTOR DEVICE MANUFACTURING METHOD, AND SEMICONDUCTOR DEVICE

BACKGROUND OF THE INVENTION

1. Field of the Invention

The present invention relates to a method of forming a silicon-containing insulating film and to a semiconductor device manufacturing method. More particularly, the present invention relates to a method suitable for forming a silicon-containing insulating film that has a low dielectric constant and can easily be etched.

2. Description of the Prior Art

In recent years, the speed of the electronic equipment has increased, and hence higher operational speeds are required of the semiconductor devices employed in the electronic equipment. One method that can accelerate the operational speed of the semiconductor device, uses a film having a low dielectric constant as the interlayer insulating film in the semiconductor device. Therefore, various interlayer insulating films having low dielectric constants have been studied recently.

It is also desired that the interlayer insulating film of the semiconductor device have not only a low dielectric constant, but also can easily be etched. If a film can easily be etched, the film is said to have an easy etching workability.

This is because if the etching workability of the interlayer insulating film is inferior, a fine opening (e.g., contact hole and via hole) or groove (e.g., damascene trench) cannot be formed in the film, which in turn poses an obstacle to providing devices having highly integrated structures.

SUMMARY OF THE INVENTION

It is an object of the present invention to provide a method of forming a silicon-containing insulating film, which is capable of forming an insulating film exhibiting both a low dielectric constant and an easy etching workability.

Another object of the present invention is to provide a semiconductor device manufacturing method which includes forming an interlayer insulating film exhibiting both a low dielectric constant and an easy etching workability.

Yet another object of the present invention is to provide a semiconductor device that has an interlayer insulating film that exhibits both a low dielectric constant and an easy etching workability.

According to the film forming method of the present invention, a silicon-containing insulating film is formed on a substrate by forming a plasma of a reaction gas that contains $H_2$, an oxidizing gas, and a compound having a siloxane bond (Si—O—Si) and a Si—R bond, wherein R is an alkyl group, and contacting the substrate with the plasma to form the silicon-containing insulating film on the substrate.

The R (alkyl group) contained in the compound having the siloxane bond (Si—O—Si) and the Si—R bond is incorporated into the silicon-containing insulating film. Since the Si—O bond in the film is not connected with the substrate where the R (alkyl group) is present, the dielectric constant at those positions is lowered compared to the remainder. Therefore, the dielectric constant of the overall film can also be lowered, and thus the silicon-containing insulating film having a low dielectric constant can be formed.

Also, since $H_2$ in the reaction gas bonds to C (carbon) in the film to generate an R group (alkyl) such as $CH_3$, etc., the number of Si—C bonds or C—C bonds in the film can be reduced. Because the Si—C bonds or the C—C bonds reduce the etching workability of the film, the silicon-containing insulating film formed as above has improved etching workability.

In addition, the dielectric constant of the silicon-containing insulating film is further lowered by the presence of the R group (alkyl) that is generated by the reaction of $H_2$ in the reaction gas and C (carbon) in the film. That is, since the Si—C bonds in the film are occupied by these R groups (alkyl), the dielectric constant of the film can be lowered.

Also, the R group (alkyl) generated by the reaction of $H_2$ in the reaction gas and C (carbon) in the film tends to remain in the film even when the film forming temperature is relatively high. As a result, even if the film forming temperature is set high, the silicon-containing insulating film having a low dielectric constant can be formed.

It should be noted that a compound having a siloxane group (Si—O—Si) and a Si—OR group (OR is alkoxyl), or a compound having a R group (alkyl) can be employed in place of the above compound having the siloxane group (Si—O—Si) and the Si—R group (R is alkyl). Employing these compounds can achieve the same advantage as those descried above.

According to the semiconductor manufacturing method of the present invention, the above film forming method is employed in forming an interlayer insulating film. The interlayer insulating film thus formed exhibits both a low dielectric constant and an easy etching workability. The former contributes to reduce parasitic capacitances between the copper wirings, while the latter facilitates formation of fine openings such as contact holes and via holes.

The semiconductor device manufactured in accordance with this method therefore has a high operating speed and a highly integrated structure.

BRIEF DESCRIPTION OF THE DRAWINGS

DETAILED DESCRIPTION OF THE PREFERRED EMBODIMENTS (1) Explanation of the Plasma CVD Apparatus Used to Form a Silicon-containing Insulating Film According to the Present Invention In FIG. 1, 101 is a chamber for forming a film, in which two opposing electrodes, i.e., a lower electrode 102 and an upper electrode 104, are provided. The lower electrode 102 serves also as a loading table on which a substrate 103 is loaded. A heater (not shown) for heating the substrate 103 up to a desired temperature is built into this lower electrode 102. In FIG. 1, 105 is a power supply line for supplying the power to the heater.

Figure 1:
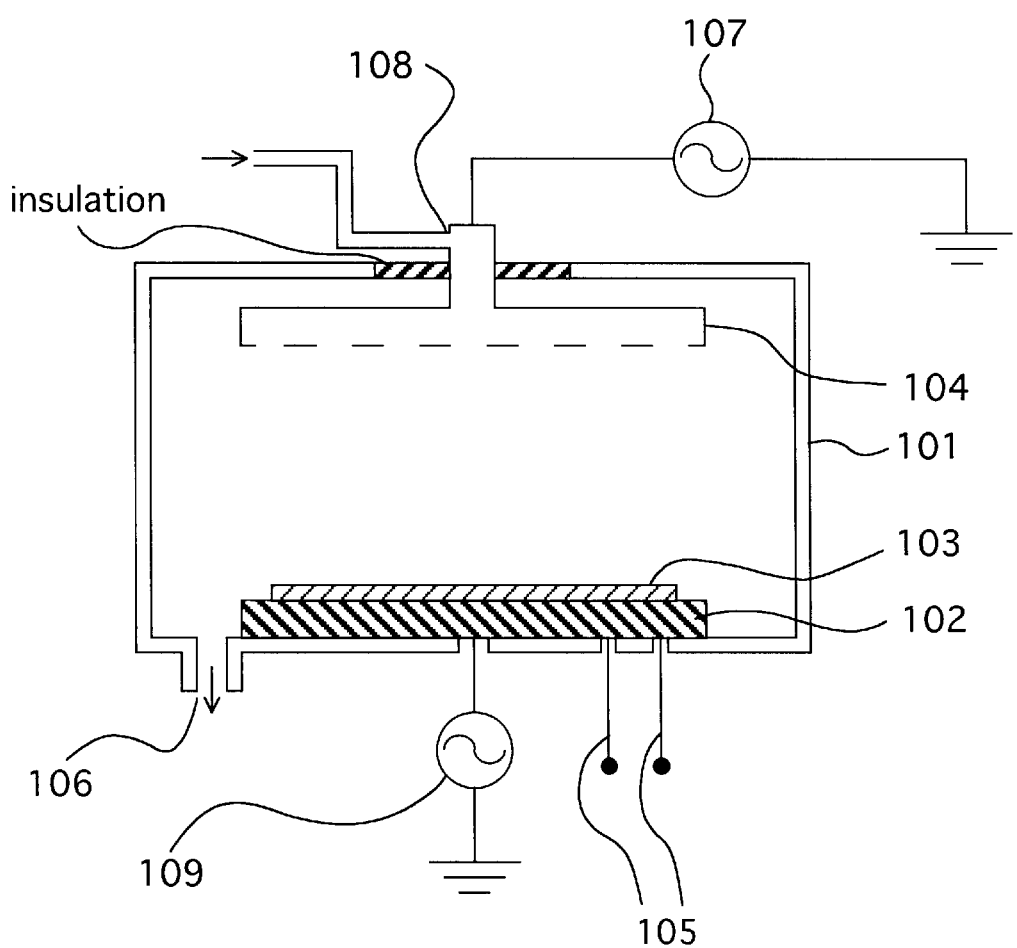
FIG. 1 is a sectional view showing a plasma enhanced CVD (plasma enhanced chemical vapor apparatus) apparatus used to form a silicon-containing insulating film according to the present invention.

In addition, the upper electrode 104 serves also as a distributor for supplying a gas into the chamber 101.

A first high frequency power supply 107 and a second high frequency power supply 109 are connected to these two electrodes (104, 102) respectively. When the high frequency power is supplied to the gas in the chamber 101 by using any one of or both of these high frequency power supplies (107, 109), the gas in the chamber 101 is plasmanized.

A gas introducing port 108 is provided at the upper electrode 104, and the gas is introduced into the chamber 101 via this gas introducing port 108. A gas exhausting port 106 is provided in the chamber 101, and the gas introduced into the chamber 101 is exhausted from the gas exhausting port 106 to reduce the pressure in the chamber 101.

(2) Explanation of the Method of the Silicon-containing Insulating Film According to the Present Invention
(i) Schematic Explanation Firstly, in order to lower the dielectric constant of the silicon-containing insulating film such as $SiO_2$ film, the $SiO_2$ film should be formed in such a way that the alkyl group (R), e.g., methyl group or the like, is contained in the film. It is supposed that if the $SiO_2$ film is formed in this manner, Si—O bonds in the $SiO_2$ film do not bind to the substrate at sites where the alkyl group (R) is present and thus the dielectric constant is lowered at those sites and hence the dielectric constant of the overall film is lowered. It is also supposed that since alkoxyl group (OR), in place of the alkyl group (R), can also occupy the Si—O bonds, inclusion of the alkoxyl group (OR) can also lower the dielectric constant of the film.

Secondly, in order to improve the etching workability of the resultant silicon-containing insulating film, the film should be formed in such a way that the Si—C bonds and the C—C bonds, which are the cause of the inferior etching workability, are reduced in the film to the extent possible. It has been empirically known that the Si—C bonds and the C—C bonds worsen the etching workability of the film.

The reaction gas used to form the silicon-containing insulating film that has a good etching workability and a low dielectric constant, may be any one of the following systems:

(compounds having a siloxane bond and a Si—R bond)+(oxidizing gas)+$H_2$     (1)

(compounds having a siloxane bond and a Si—OR bond)+(oxidizing gas)+$H_2$     (2)

(Si (silicon) compounds having R)+(oxidizing gas)+$H_2$     (3)

It should be noted that $H_2$ is contained in all of these reaction gases. As described below, the number of the Si—C bonds and the C—C bonds in the film is reduced by the $H_2$.

(ii) Explanation of Film Forming Conditions.

Film forming conditions suitable for forming the silicon-containing insulating film by employing the above reaction gases will be explained with reference to FIGS. 2A and 2B.

Figure 2A:
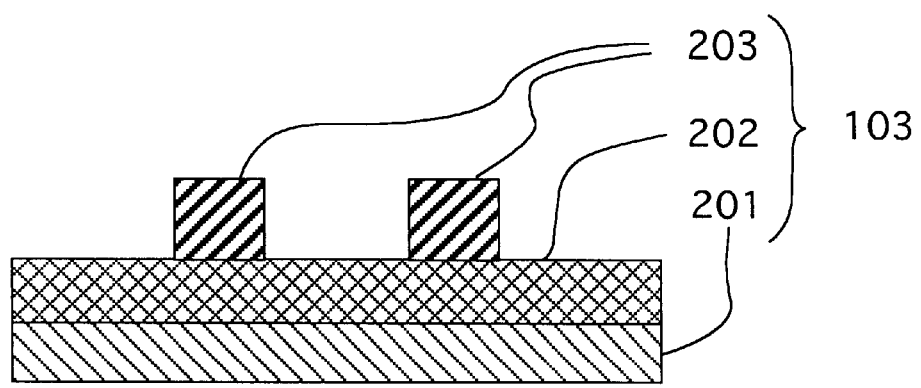
FIGS. 2A and 2B are sectional views showing a method of forming a silicon-containing insulating film of an embodiment of the present invention.

FIG. 2A shows a silicon substrate 201 having a surface on which a BPSG (borophospho silicate glass) film 202 is formed. An aluminum film is then formed on the BPSG film 202, and aluminum wirings 203 are subsequently formed as a pattern of the aluminum film. The silicon substrate 201, the BPSG film 202, and the aluminum wirings 203 constitute a substrate 103.

Figure 2B:
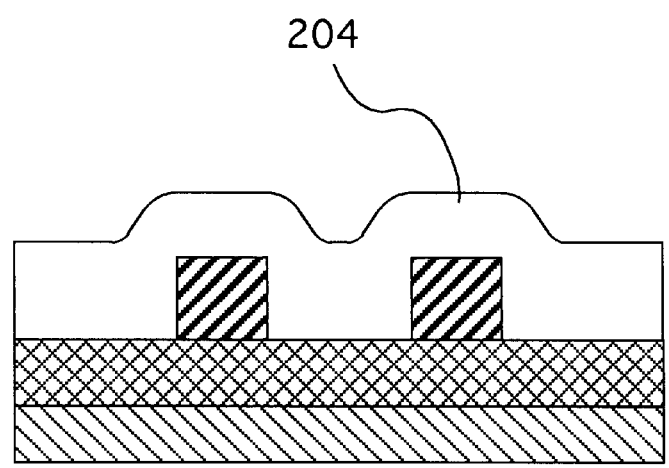

Then, as shown in FIG. 2B, a silicon-containing insulating film 204 is formed on the substrate 103. This silicon-containing insulating film 204 is formed by loading the substrate 103 on the lower electrode 102 (see FIG. 1), introducing the reaction gas via the gas introducing port 108, heating the lower electrode 102 up to a predetermined temperature, and applying the high frequency power to the reaction gas by the first and second high frequency power supplies 107, 109. At the same time, the reaction gas is exhausted via the gas exhausting port 106 to maintain the inside of the chamber 101 at a predetermined pressure.

The reaction gas may be any one of the following three systems: (1) (a compound having a siloxane bond and a Si—R bond)+(an oxidizing gas)+$H_2$, (2) (a compound having a siloxane bond and a Si—OR bond)+(an oxidizing gas)+$H_2$, and (3) (a Si (silicon) compound having an R group)+(an oxidizing gas)+$H_2$, as mentioned above. The film forming conditions for the three respective reaction systems are described below.

the system employing a compound having a siloxane bond and a Si—R bond)+(an oxidizing gas)+$H_2$ as the reaction gas.     (1)

The following are specific examples of the compounds having a siloxane bond and a Si—R bond which may be employed.

HMDS (hexamethyldisiloxane: $(Si(CH_3)_3)_2O$)
TEDS (tetraethyldisiloxane: $(SiH(C_2H_5)_2)_2O$)
TMDS (tetramethyldisiloxane: $(SiH(CH_3)_2)_2O$)
TMCTS (tetramethylcyclotetrasiloxane: $(SiH(CH_3))_4O_4$)
TECTS (tetraethylcyclotetrasiloxane: $(SiH(C_2H_5))_4O_4$)
OMCTS (octomethylcyclotetrasiloxane: $(Si(CH_3)_2)_4O_4$)

The above compounds are liquid at room temperature (20° C.).

The film forming conditions for this case are given in Table 1.

TABLE 1

| | |
|---|---|
| Flow rate of the compound having a siloxane bond (Si—O—Si) and Si—R bond | 50 sccm |
| Flow rate of the oxidizing gas | see Table 2 |
| Flow rate of $H_2$ | 50 sccm |
| Flow rate of the inert gas (He) | 100 sccm |
| Temperature of the substrate 103 | 370° C. |
| Pressure in the chamber 101 | 1.75 Torr |
| Frequency of the high frequency power applied by the first high frequency power supply 107 | 13.56 MHz |
| Power of the high frequency power applied by the first high frequency power supply | 300 W |
| Frequency of the high frequency power applied by the second high frequency power supply 109 | 380 KHz |
| Power of the high frequency power applied by the second high frequency power supply 109 | 10 W |

Compounds having both a siloxane bond (Si—O—Si) and a Si—R bond as set forth in the first line of Table 1, include HMDS, TEDS, TMDS, TMCTS, TECTS, and OMCTS, as mentioned above. Any one of them may be contained in the reaction gas.

These compounds, liquid at room temperature, are introduced into the liquid mass flowmeter (not shown) in the liquid state to adjust their flow rates. Then, these compounds are introduced into the vaporizer (not shown) where they are heated to be vaporized, and then supplied to the chamber 101 in the vaporized state. The flow rate of these compounds in Table 1 is that of the vapor.

It should be noted that the inert gas (He) set forth in the fourth line of Table 1 is not mandatory. Even if the inert gas is not contained in the reaction gas, advantages similar to those described in the following can be achieved.

Examples of the oxidizing gas set forth in the second line of Table 1, are $N_2O$, $O_2$, $H_2O$, and $C_2H_5OH$. At least one of them may be contained in the reaction gas. Flow rates for one of these oxidizing gases alone added into the reaction gas, i.e., added with no other oxidizing gas, were as follows in Table 2.

TABLE 2

| Oxidizing gas | Flow rate |
| --- | --- |
| $N_2O$ where used alone: | 100 sccm |
| where combined with other oxidizing gas: | 50 sccm |
| $O_2$ | 50 sccm |
| $H_2O$ | 50 sccm |
| $C_2H_5OH$ | 50 sccm |

It should be noted that the flow rate of $N_2O$, as set forth in the second line of Table 2, is 100 sccm when used alone, whereas it is 50 sccm when combined with other oxidizing gases. Accordingly, if $N_2O$ is combined with $H_2O$, for example, the flow rate of $N_2O$ is 50 sccm and the flow rate of $H_2O$ is 50 sccm.

Also, the flow rates of $H_2O$ and $C_2H_5OH$ set forth in the fourth and fifth lines of Table 2, respectively, are for the vaporized state.

According to a test measurement carried out by the inventors of the present invention, the dielectric constant of the silicon-containing insulating film 204 formed in accordance with the above conditions was 2.7 at 1 MHz when the film thickness was 500 nm. This value is lower than the dielectric constant 4.0 to 4.1 of the conventional $SiO_2$ film.

In addition, according to another test measurement carried out by the inventors of the present invention, it is apparent that the etching workability of the silicon-containing insulating film 204 is improved as compared to the case where $H_2$ is not contained in the reaction gas.

the system where (the compound having the siloxane bond and the Si—OR bond)+(the oxidizing gas)+$H_2$ is employed as the reaction gas.     (2)

Specific examples of the compound having the siloxane bond and the Si—OR bond which can be employed in the present invention are:

tetramethoxydisiloxane: $(SiH(CH_3O)_2)_2O)$
tetraethoxydisiloxane: $(SiH(C_2H_5O)_2)_2O)$
tetramethoxycyclotetrasiloxane: $(SiH(CH_3O))_4O_4)$
tetraethoxycyclotetrasiloxane: $(SiH(C_2H_5O))_4O_4)$ The film forming conditions for this reaction system are given in Table 3.

TABLE 3

| | |
| --- | --- |
| Flow rate of the compound having siloxane bond (Si—O—Si) and Si—OR bond | 50 sccm |
| Flow rate of the oxidizing gas | see Table 2 |
| Flow rate of $H_2$ | 50 sccm |
| Flow rate of the inert gas (He) | 100 sccm |
| Temperature of the substrate 103 | 370° C. |
| Pressure in the chamber 101 | 1.75 Torr |
| Frequency of the high frequency power applied by the first high frequency power supply 107 | 13.56 MHz |
| Power of the high frequency power applied by the first high frequency power supply 107 | 200 W |
| Frequency of the high frequency power applied by the second high frequency power supply 109 | 380 KHz |
| Power of the high frequency | 0 W (not applied) |

TABLE 3-continued

| | |
| --- | --- |
| power applied by the second high frequency power supply 109 | |

As the compound having the siloxane bond (Si—O—Si) and the Si—OR bond set forth in the first line of Table 3, tetramethoxydisiloxane, tetraethoxydisiloxane, tetramethoxycyclotetrasiloxane, and tetraethoxycyclotetrasiloxane may be used as described above. Any one of them may be contained in the reaction gas.

These liquid compounds are introduced into the liquid mass flowmeter (not shown) in the liquid state to adjust their flow rates. Then, these compounds are introduced into the vaporizer (not shown) where they are heated to be vaporized, and then supplied to the chamber 101 in the vaporized state. The flow rates of these compounds given in Table 3 are for the vaporized state.

As set forth in the tenth line of Table 3, where the compound having the siloxane bond and the Si—OR bond is employed, the second high frequency power supply 109 is not employed. In other words, only the high frequency power from the first high frequency power supply 107 is applied in this case.

In addition, the inert gas (He) set forth in the forth line of Table 3 is not mandatory. Even if the inert gas is not contained in the reaction gas, advantages similar to those described in the following can be achieved.

Also, examples of the oxidizing gas set forth in the second line of Table 3, are $N_2O$, $O_2$, $H_2O$, and $C_2H_5OH$. At least one of them may be contained in the reaction gas. If any one of these oxidizing gases is added alone into the reaction gas, i.e., added with no other oxidizing gas, its flow rate is as given as in Table 2.

According to a test measurement carried out by the inventors of the present invention, the dielectric constant of the silicon-containing insulating film 204 formed in accordance with the above conditions was 2.9 at 1 MHz when the film thickness was 500 nm. This value is lower than the dielectric constant 4.0 to 4.1 of the conventional $SiO_2$ film.

In addition, according to another test measurement carried out by the inventors of the present invention, it is apparent that the etching workability of the silicon-containing insulating film 204 can be improved as compared to the case where $H_2$ is not contained in the reaction gas.

the system employing a Si (silicon) compound having R+(oxidizing gas)+$H_2$ is employed as the reaction gas.     (3)

Specific examples of the Si (silicon) compound having R which may be employed in this case are:

monomethylsilane $(SiH_{3(CH3)})$
dimethylsilane $(SiH_{2(CH3)2})$
trimethylsilane $(SiH(CH_3)_3)$
tetramethylsilane $(Si(CH_3)_4)$
monoethylsilane $(SiH_{3(C2H5)})$
diethylsilane $(SiH_{2(C2H5)2})$
triethylsilane $(SiH(C_2H_5)_3)$
tetraethylsilane $(Si(C_2H_5)_4)$ The film forming conditions of this case are given in Table 4.

TABLE 4

| | |
|---|---|
| Flow rate of the Si (silicon) compound having R | 50 sccm |
| Flow rate of the oxidizing gas | see Table 2 |
| Flow rate of $H_2$ | 50 sccm |
| Flow rate of the inert gas (He) | 100 sccm |
| Temperature of the substrate 103 | 370° C. |
| Pressure in the chamber 101 | 1 Torr |
| Frequency of the high frequency power applied by the first high frequency power supply 107 | 13.56 MHz |
| Power of the high frequency power applied by the first high frequency power supply 107 | 300 W |
| Frequency of the high frequency power applied by the second high frequency power supply 109 | 380 KHz |
| Power of the high frequency power applied by the second high frequency power supply 109 | 0 W (not applied) |

Examples of the Si (silicon) compound having R set forth in the first line of Table 4, are monomethylsilane, dimethylsilane, trimethylsilane, tetramethylsilane, monoethylsilane, diethylsilane, triethylsilane, and tetraethylsilane, as listed above. Any one of them may be contained in the reaction gas.

As can been seen from Tables 1, 3, and 4, a film having a low dielectric constant can be formed at a pressure of about 2 Torr when (1) the compound having the siloxane bond and the Si—R bond and (2) the compound having the siloxane bond and the Si—OR bond are employed, whereas it can be formed at the pressure of about 1 Torr when (3) the Si (silicon) compound having R is employed.

As set forth in the tenth line of Table 4, if the Si (silicon) compound having R is employed, the second high frequency power supply 109 is not employed. In other words, only the high frequency power from the first high frequency power supply 107 is applied in this case.

It should be noted that the inert gas (He) set forth in the fourth line of Table 4 is not mandatory. Even if the inert gas is not contained in the reaction gas, advantages similar to those described in the following can be achieved.

Examples of the oxidizing gas set forth in the second line of Table 4, include $N_2O$, $O_2$, $H_2O$, and $C_2H_5OH$. At least one of them may be contained in the reaction gas. If any one of these oxidizing gases is added into the reaction gas alone, i.e., added with no other oxidizing gas, the flow rate will be as given in Table 2.

According to a test measurement carried out by the inventors of the present invention, the dielectric constant of the silicon-containing insulating film 204 formed in accordance with the above conditions was 2.7 at 1 MHz when the film thickness was 500 nm. This value is lower than the dielectric constant 4.0 to 4.1 of the conventional $SiO_2$ film.

In addition, according to another test measurement carried out by the inventors of the present invention, it became apparent that the etching workability of the silicon-containing insulating film 204 is improved, as compared to the case where $H_2$ is not contained in the reaction gas.

As described above, in all of the above systems (1) to (3), a silicon-containing insulating film 204 that has a low dielectric constant and easy etching workability is formed. First of all, the reason for the low dielectric constant is that the R (alkyl group) or the OR (alkoxyl group), contained in the compound having the siloxane bond and the Si—R bond, the compound having the siloxane bond and the Si—OR bond, and the Si (silicon) compound having R, can be contained in the silicon-containing insulating film 204. That is, the Si—O bond in the film is disconnected at sites where the R (alkyl group) or the OR (alkoxyl group) is contained, and hence the dielectric constant at those sites is lowered. Therefore, the dielectric constant of the overall film can also be lowered. Second, the reason for the improvement of the etching workability is that, since $H_2$ in the reaction gas bonds to C (carbon) in the film to generate the alkyl group such as $CH_3$, etc., the number of the Si—C bonds or the C—C bonds in the film can be reduced.

Here, it should be noted that the alkyl group generated by bonding of $H_2$ in the reaction gas to C (carbon) in the film can contribute also to reduce the dielectric constant of the silicon-containing insulating film 204 and, accordingly, the dielectric constant of the film can be reduced further. That is, the Si—O bond in the film is disconnected where the alkyl group generated in this manner is present, and thus the dielectric constant of the film can be lowered.

It was supposed that the alkyl group such as $CH_3$, etc. in the film easily leaked from the film as the film forming temperature is increased. However, it has now become apparent that the alkyl group generated by $H_2$ in the reaction gas and C (carbon) in the film can remain in the film even when the film forming temperature is relatively high (about 370° C.). Accordingly, if $H_2$ is contained in the reaction gas, the silicon-containing insulating film 204 having a low dielectric constant can be formed at a high film forming temperature. As a result, since the temperature range for forming the film can be extended, the ranges of the film forming conditions can also be extended.

Because of theses advantages, the silicon-containing insulating film 204 is particularly preferable for the interlayer insulating film in the damascene process. In the following, an embodiment of the semiconductor device manufacturing method of the present invention, in which the above film forming method is applied to a damascene process, will be explained.

Figure 3A:
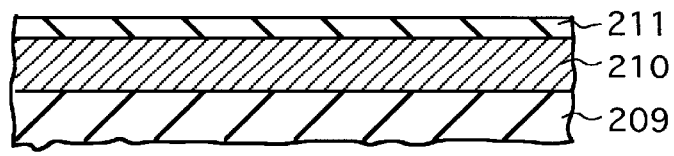
FIGS. 3A to 3F are sectional views showing a semiconductor device manufacturing method of an embodiment of the present invention.

Step 1 (FIG. 3A):

A lower copper wiring layer 210 is formed on a silicon substrate 209. Then, a block insulating film 211 such as a SiN film, etc. is formed on the lower copper wiring layer 210. The block insulating film is defined as a film having a function of an etching stopper film when forming a opening (e.g., contact hole and via hole), together with a function of serving as a barrier metal film for copper. The block insulating film 211 can be omitted in some cases.

Figure 3B:
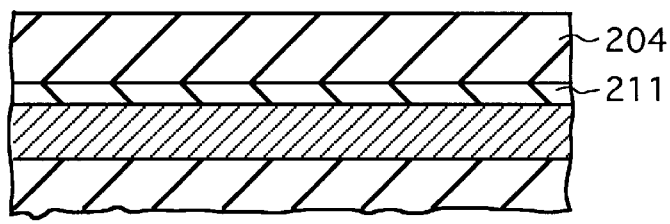

Step 2 (FIG. 3B):

The silicon-containing insulating film 204, which serves as an interlayer insulating film, is formed on the block insulating film 211. Where the block insulating film 211 is omitted, the silicon-containing insulating film 204 is formed on the lower copper wiring layer 210. The silicon-containing insulating film 204 may be formed in accordance with the conditions listed in Tables 1 to 4, all of which have already been explained above.

Figure 3C:
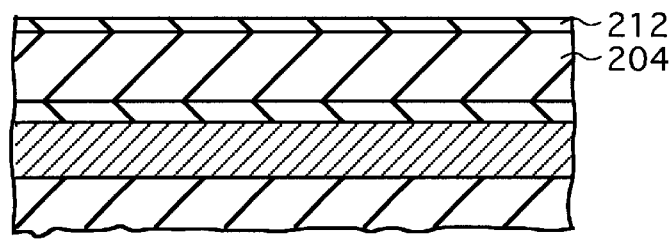

Step 3 (FIG. 3C):

A protection film 212 is formed on the silicon-containing insulating film 204. This protection film 212 consists of a dense silicon oxide film having a good film property. The protection film 212 serves to prevent the silicon-containing insulating film 204 from being modified during the etching and ashing processes. The protection film 212 can be omitted in some cases.

Figure 3D:
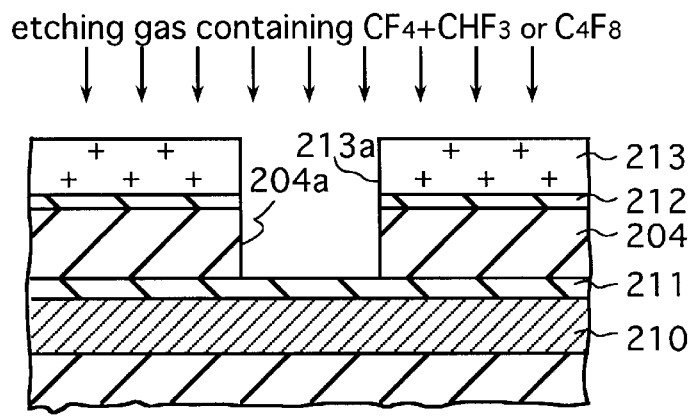

Step 4 (FIG. 3D):

A photoresist 213 is coated on the protection film 212. Where the protection film 212 is omitted, the photoresist 213 is formed on the silicon-containing insulating film 204. Next, an opening 213a is formed in the photoresist 213 by photolithography. Then, an opening 204a that reaches the block insulating film 211 is formed in the silicon-containing insulating film 204 by etching via the opening 213a. Where the block insulating film 211 is omitted, the opening 204a reaches the lower copper wiring layer 210.

This etching is performed by RIE (Reactive Ion Etching), and a $CF_4+CHF_3$-based gas mixture or a $C_4F_8$-based gas mixture is employed as the etching gas. Since the block insulating film 211 has etching resistance against these etching gases, the block insulating film 211 is not etched. In addition, the lower copper wiring layer 210 is protected against exposure to the etching gas by the block insulating film 211.

As described above, the silicon-containing insulating film 204 is superior in etching workability. Accordingly, in this step 4, it is possible to easily form the fine opening 204a with good precision. It should be noted that a groove (e.g., damascene trench), instead of the opening 204a, may be formed. Such a groove can also be easily formed with good precision.

Figure 3E:
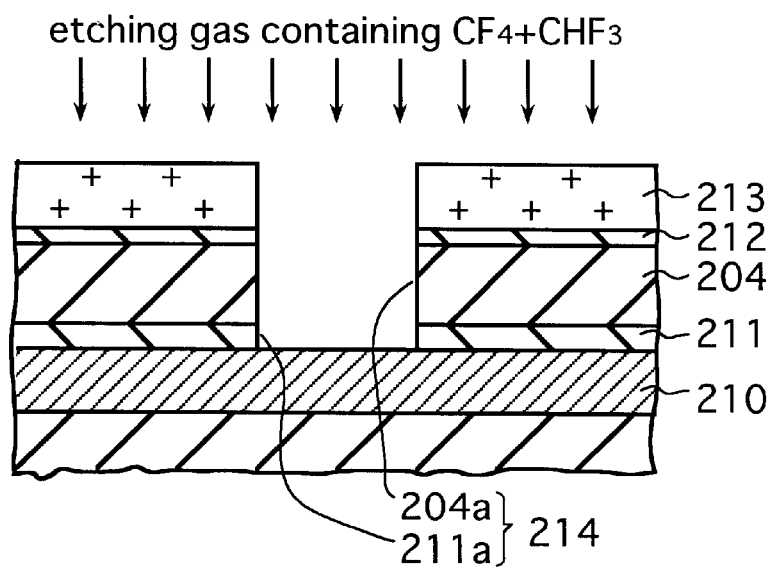

Step 5 (FIG. 3E):

Using the silicon-containing insulating film 204 as a mask, the block insulating film 211 located below the opening 204a is removed by selective etching.

Where the block insulating film is omitted, this step is not needed.

This etching is carried out by RIE. The $CF_4+CHF_3$-based mixed gas, the composition ratio of which is changed from that of the etching gas used to etch the silicon-containing insulating film 204, is employed as the etching gas. An opening 211a reaching the lower copper wiring layer 210 is formed in the block insulating film 211 by this step 5. These openings 211a and 204a constitute a via hole 214.

Figure 3F:
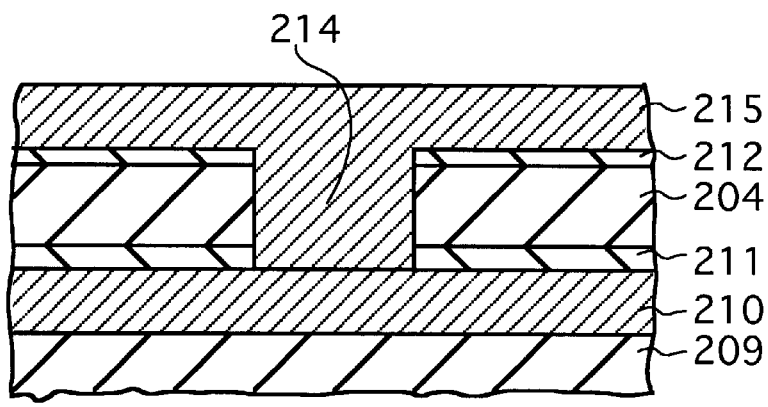

Step 6 (FIG. 3F):

A barrier metal film (not shown) such as a TiN film, etc. is formed on the silicon-containing insulating film 204 and on the inner wall of the via hole 214 by sputtering, CVD, or the like, in order to prevent copper from diffusing into the silicon-containing insulating film 204. Then, a copper seed layer (not shown) is formed on this barrier metal film.

Then, a copper film 215 is plated on the copper seed layer while using the copper seed layer as a current feeding layer. The copper plated film 215 formed over the silicon-containing insulating film 204 serves as an upper copper wiring layer. On the other hand, the copper plated film 215 formed in the via hole 214 serves to electrically connect the upper copper wiring layer and the lower copper wiring layer 210.

By this step, the damascene process to which the present invention is applied is completed. In this process, a structure is formed in which the lower copper wiring layer 210 and the upper copper wiring layer 215 are separated by the silicon-containing insulating film 204 having the low dielectric constant. Since the silicon-containing insulating film 204 has the low dielectric constant, parasitic capacitances of the lower copper wiring layer 210 and the upper copper wiring layer 215 can be reduced.

As described above, according to the film forming method of the present invention, the silicon-containing insulating film is formed on the substrate by plasmanizing a reaction gas that contains the compound having the siloxane bond and the Si—R bond (R is alkyl group), the oxidizing gas, and $H_2$ to produce a reaction between the plasma components.

Since the R (alkyl group) is contained in the silicon-containing insulating film formed by this method, the dielectric constant of the silicon-containing insulating film can be lowered. Also, since $H_2$ in the reaction gas bonds to C (carbon) in the film, the number of the Si—C bonds and the C—C bonds contained in the film can be reduced and also the R (alkyl group) such as $CH_3$, etc. can be generated. If the number of the Si—C bonds and the C—C bonds are reduced in this manner, the etching workability of film can be improved. Also, the dielectric constant of the film can be lowered much more by the R (alkyl) group such as $CH_3$, etc., which is generated by $H_2$ in the reaction gas and C (carbon) in the film.

If the compound having the siloxane bond and the Si—OR bond (OR is alkoxyl group) or the Si (silicon) compound having the R (alkyl) group is employed in place of the above compound having the siloxane bond and the Si—R bond (R is alkyl group), advantages similar to those described above are achieved.

What is claimed is:

1. A method for forming a silicon-containing insulating film on a substrate, said method comprising:
    forming a plasma of a reaction gas that contains $H_2$, an oxidizing gas, and a compound having a siloxane bond and a Si—R bond, wherein R is an alkyl group; and
    contacting the substrate with said plasma, with components of said plasma reacting to form the silicon-containing insulating film on the substrate.

2. A method according to claim 1, wherein the compound having the siloxane bond and the Si—R bond is selected from the group consisting of $(Si(CH_3)_3)_2O$, $(SiH(C_2H_5)_2)_2O$, $(SiH(CH_3)_2)_2O$, $(SiH(CH_3))_4O_4$, $(SiH(C_2H_5))_4O_4$, and $(Si(CH_3)_2)_4O_4$.

3. A method according to claim 1 wherein $H_2$ in the reaction gas bonds to carbon in the insulating film to form alkyl groups in the insulating film.

4. A method according to claim 1 wherein said forming of plasma is by passing the reaction gas between two electrodes and supplying high frequency power to at least one of the electrodes.

5. A film forming method according to claim 1, wherein the oxidizing gas contains at least one of $N_2O$, $O_2$, $H_2O$, and $C_2H_5OH$.

6. A method for forming a silicon-containing insulating film on a substrate, said method comprising:
    forming a plasma of a reaction gas that contains $H_2$, an oxidizing gas, and a compound having a siloxane bond and a Si—OR bond wherein OR is an alkoxyl group ; and
    contacting the substrate with said plasma, with components of said plasma reacting to form the silicon-containing insulating film on the substrate.

7. A method according to claim 6, wherein the compound having the siloxane bond and the Si—OR bond is selected from the group consisting of $(SiH(CH_3O)_2)_2O$, $(SiH(C_2H_5O)_2)_2O$, $(SiH(CH_3O))_4O_4$, and $(SiH(C_2H_5O))_4O_4$.

8. A film forming method according to claim 6 wherein the oxidizing gas contains at least one of $N_2O$, $O_2$, $H_2O$, and $C_2H_5OH$.

9. A method according to claim 6 wherein $H_2$ in the reaction gas bonds to carbon in the insulating film to form alkyl groups in the insulating film.

10. A method according to claim 6 wherein said forming of plasma is by passing the reaction gas between two electrodes and supplying high frequency power to at least one of the electrodes.

11. A method for forming a silicon-containing insulating film on a substrate, said method comprising:
    forming a plasma of a reaction gas that contains $H_2$, an oxidizing gas, and a silicon compound containing an alkyl group; and
    contacting the substrate with said plasma, with components of said plasma reacting to form the silicon-containing insulating film on the substrate.

12. A method according to claim 11, wherein the silicon compound having the alkyl group is selected from the group consisting of $SiH_3(CH_3)$, $SiH_2(CH_3)_2$, $SiH(CH_3)_3$, $Si(CH_3)_4$, $SiH_3(C_2H_5)$, $SiH_2(C_2H_5)_2$, $SiH(C_2H_5)_3$, and $Si(C_2H_5)_4$.

13. A film forming method according to claim 11 wherein the oxidizing gas contains at least one of $N_2O$, $O_2$, $H_2O$, and $C_2H_5OH$.

14. A method according to claim 11 wherein $H_2$ in the reaction gas bonds to carbon in the insulating film to form alkyl groups in the insulating film.

15. A method according to claim 11 wherein said forming of plasma is by passing the reaction gas between two electrodes and supplying high frequency power to at least one of the electrodes.

* * * * *